(12) United States Patent
Vaccaro et al.

(10) Patent No.: US 7,733,935 B2
(45) Date of Patent: Jun. 8, 2010

(54) NITRIDE SEMICONDUCTOR LASER DEVICE AND METHOD OF PRODUCING THE SAME

(75) Inventors: Pablo Vaccaro, Tenri (JP); Yuhzoh Tsuda, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 24 days.

(21) Appl. No.: 12/289,128

(22) Filed: Oct. 21, 2008

(65) Prior Publication Data

US 2009/0103584 A1    Apr. 23, 2009

(30) Foreign Application Priority Data

Oct. 23, 2007    (JP) .............................. 2007-274815

(51) Int. Cl.
*H01S 3/04* (2006.01)
*H01S 5/00* (2006.01)

(52) U.S. Cl. .................... 372/46.01; 372/43.01; 372/54

(58) Field of Classification Search ............... 372/43.01, 372/46.012, 54; 438/33; 257/E33.032
See application file for complete search history.

(56) References Cited

U.S. PATENT DOCUMENTS

| 4,546,481 A | 10/1985 | Yamamoto et al. |
| 4,983,541 A | 1/1991 | Kumabe |
| 5,113,405 A | 5/1992 | Opschoor et al. |
| 5,395,793 A | 3/1995 | Charbonneau et al. |
| 2001/0017375 A1 | 8/2001 | Hirata et al. |

FOREIGN PATENT DOCUMENTS

| JP | 58-225681 | 12/1983 |
| JP | 07-135374 | 5/1995 |
| JP | 2003-198057 | 7/2003 |

*Primary Examiner*—Armando Rodriguez
(74) *Attorney, Agent, or Firm*—Harness, Dickey & Pierce, P.L.C.

(57) ABSTRACT

A nitride semiconductor laser device has a semiconductor multi-layer structure that includes a lower clad layer of a first conductive type, an active layer, and an upper clad layer of a second conductive type stacked in this order on a substrate, wherein a layer under the active layer includes a stripe-like trench; the semiconductor multi-layer structure includes a stripe-like optical cavity arranged along the stripe-like trench; the stripe-like trench has a narrower width in its both end regions compared to its central main region; and the active layer is formed of a nitride semiconductor containing In.

6 Claims, 4 Drawing Sheets

| Al(0.3)Ga(0.7)N 20 nm |
| --- |
| GaN 50 nm |
| In(0.02)Ga(0.98)N 8 nm |
| In(0.1)Ga(0.9)N:Si 3 nm |
| In(0.02)Ga(0.98)N 8 nm |
| In(0.1)Ga(0.9)N:Si 3 nm |
| In(0.02)Ga(0.98)N 8 nm |
| In(0.1)Ga(0.9)N:Si 3 nm |
| In(0.02)Ga(0.98)N 8 nm |
| n-GaN buffer 1 μm |
| GaN template 3 μm |
| Sapphire |

(A)　　　　　　　　(B)

(A) (B)

TN
TW

NITRIDE SEMICONDUCTOR LASER DEVICE AND METHOD OF PRODUCING THE SAME

This nonprovisional application is based on Japanese Patent Application No. 2007-274815 filed on Oct. 23, 2007 with the Japan Patent Office, the entire contents of which are hereby incorporated by reference.

BACKGROUND OF THE INVENTION

1. Field of the Invention

The present invention relates to a high-power-output semiconductor laser device, and particularly to a high-power-output nitride semiconductor laser device that is unlikely to cause catastrophic optical damage (COD) in both end mirror parts of its optical cavity and a method of producing the same.

2. Description of the Background Art

A semiconductor laser device operating at high power output has a limited lifetime until it causes a malfunction. The most common malfunction in the high-power-output semiconductor laser device is catastrophic optical damage (COD) in both end mirror parts of the optical cavity.

A mirror part of an optical cavity of a semiconductor laser device includes a high density of non-radiative recombination centers which act as non-radiative recombination sites for carriers. Non-radiative recombination current generates heat. Besides, a relatively low density of carriers near the mirror part cause absorption of laser light. Heat generated by both the non-radiative recombination current and light absorption causes a temperature rise of the mirror part. When the semiconductor temperature rises, its energy band gap decreases. The band gap reduction acts to promote further light absorption. Such increased light absorption may cause a runaway process damaging the mirror part of the laser device under high-power-output operation, which may result in a malfunction of the laser device.

In order to alleviate such an output power limitation, various kinds of laser structures have been proposed. One example is known as a NAM (non-absorbing mirror) structure. In order to achieve this structure, the energy band gap of the active layer in a laser device is made larger in a region near the mirror than in other regions by utilizing diffusion of impurities, ion implantation of impurities, or epitaxial re-growth. A laser device having this NAM structure is able to operate at an output power that is greater by about one order of magnitude compared to conventional laser devices.

However, there are various limitations in such methods of producing the NAM structure as described in published documents. For example, both of the methods disclosed in U.S. Pat. Nos. 4,983,541 and U.S. Pat. No. 5,113,405 are inconvenient methods, each of which needs two-step epitaxial growth. While U.S. Pat. No. 5,395,793 discloses a method of utilizing low energy ion implantation so as to cause a distribution of defects inside a layer above a quantum well layer, it is necessary that part of the defects is diffused downward and mixed with the quantum well by heating subsequent to the ion implantation.

SUMMARY OF THE INVENTION

In view of the state of the prior art as described above, it is an object of the present invention to provide a nitride semiconductor laser device capable of outputting high power light and having a long lifetime, in a relatively simple and reliable manner.

The nitride semiconductor laser device of the present invention has a semiconductor multi-layer structure that includes at least a lower clad layer of a first conductive type, an active layer, and an upper clad layer of a second conductive type stacked in this order on a substrate, wherein a layer under the active layer includes a stripe-like trench; the semiconductor multi-layer structure includes a stripe-like optical cavity arranged along the stripe-like trench; the stripe-like trench has a narrower width in its both end regions compared to its central main region; and the active layer is formed of a nitride semiconductor containing In.

In this nitride semiconductor laser device, the active layer has a lower In concentration in both of the narrower end regions of the stripe-like trench than in the central main region. Further, the active layer has a greater energy band gap in both of the narrower end regions of the stripe-like trench than in the central main region. Furthermore, the active layer has a smaller thickness in both of the narrower end regions of the stripe-like trench than in the central main region.

Such a nitride semiconductor laser device may be preferably produced by forming the stripe-like trench including alternate wide-width regions and narrow-width regions on the substrate by etching; depositing the lower clad layer of the first conductive type, the active layer, and the upper clad layer of the second conductive type on the substrate in this order; conducting cleavage across each of the narrow-width regions of the stripe-like trench; and conducting chip segmentation for each of the stripe-like optical cavity.

The nitride semiconductor laser device may also be preferably produced by depositing up to the lower clad layer of the first conductive type on the substrate; forming the stripe-like trench including alternate wide-width regions and narrow-width regions by etching the lower clad layer; depositing the active layer and the upper clad layer of the second conductive type in this order; conducting cleavage across each of the narrow-width regions of the stripe-like trench; and conducting chip segmentation for each of the stripe-like optical cavity.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2(A) and 2(B) are cathode luminescence images of the In-containing nitride semiconductor multi-layer structure of FIG. 1, wherein FIG. 2(A) is a luminescence image at a wavelength of 390 nm and FIG. 2(B) is a luminescence image at a wavelength of 430 nm.

DESCRIPTION OF THE PREFERRED EMBODIMENTS

In the case of growing a nitride semiconductor active layer containing In on an underlying layer having a trench by MOCVD (metalorganic chemical vapor deposition), the present inventors experimentally found that In atoms have a tendency to move outside the trench region.

Figures 1, 2:
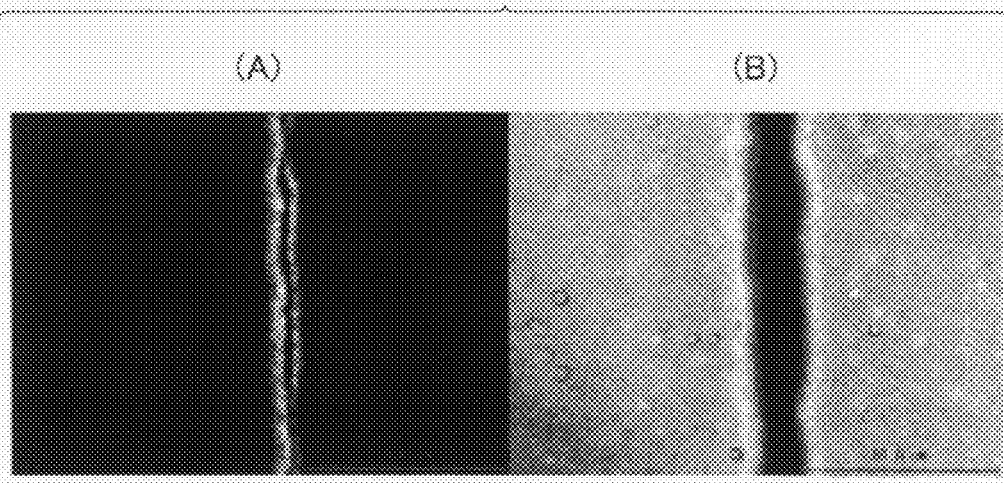
FIG. 1 is a schematic sectional view showing an In-containing nitride semiconductor multi-layer structure formed on a substrate including a trench in an experiment carried out by the present inventors.

FIG. 1 is a schematic sectional view showing a multi-layer structure including an active layer having a multiple quantum well structure used in the experiment by the present inventors. In drawings of the present application, dimensional relationships such as length, width, and thickness are arbitrarily changed for clarity and simplification of the drawings and do not represent actual dimensional relationships. In particular, the thickness is changed in an arbitrary manner. In the drawings of the present application, the same reference numeral represents the same part or a corresponding part.

In FIG. 1, an n-type GaN buffer layer of 1 μm thickness was deposited on a GaN/sapphire substrate composed of a GaN template layer of 3 μm thickness on a sapphire substrate. Although not shown in FIG. 1, a trench of 20 μm width and 0.6 μm depth was formed on the top face of the GaN/sapphire substrate.

On the n-type GaN buffer layer, an $In_{0.02}Ga_{0.98}N$ barrier layer of 8 nm thickness and a Si-doped $In_{0.1}Ga_{0.9}N$ well layer of 3 nm thickness were alternately deposited in triplicate and lastly an $In_{0.02}Ga_{0.98}N$ barrier layer of 8 nm thickness was deposited to thereby form a multiple quantum well structure.

A GaN layer of 50 nm thickness and an $Al_{0.3}Ga_{0.7}N$ layer of 20 nm thickness were deposited on the multiple quantum well structure. The multi-layer structure of FIG. 1 formed in this manner was analyzed by using cathode luminescence spectrometry.

FIGS. 2(A) and 2(B) show cathode luminescence radiation from the multi-layer structure of FIG. 1. FIG. 2(A) shows luminescence radiation at a wavelength of 390 nm, and FIG. 2(B) shows luminescence radiation at a wavelength of 430 nm.

As seen from FIG. 2(A), light of 390 nm wavelength is radiated from the trench region but is not radiated from the flat mesa regions. On the other hand, as seen from FIG. 2(B), light of 430 nm wavelength is radiated from the flat mesa regions but is not radiated from the trench region.

The result of FIGS. 2(A) and 2(B) means that the quantum well layer has a large energy band gap of about 3.18 eV in the trench region but has a small energy band gap of about 2.88 eV in the flat mesa regions.

Either one or both of the following physical phenomena (a) and (b) may produce the energy bandgap difference:

(a) In the GaN-based semiconductor layer containing In, it is known that the energy band gap increases as the In concentration decreases. That is, the result of FIGS. 2(A) and 2(B) may be due to In atoms in the quantum well layer moving from inside the trench region to outside the trench region.

(b) The energy bandgap of a quantum well becomes larger when the quantum well thickness decreases. That is, it can be understood that the thickness of the quantum well layer tends to decrease inside the trench region than outside the trench region due to migration of In and Ga atoms.

The present inventors also found, from another experiment using a GaN/sapphire substrate having a relatively wider trench, that the quantum well layer has a greater energy band gap in a region near an edge of the trench compared to the central region that is far in the width direction from the edge. That is, the energy band gap in the quantum well layer is smaller in a wide-width trench region than in a narrow-width trench region.

From the results of the above experiments conducted by the present inventors, it can be understood that it is possible to fabricate a nitride semiconductor laser device having non-absorbing mirrors by narrowing the width in the both end regions of the trench than in the central main region. That is, by making the trench have a smaller width in regions near the mirrors, the active layer has a decreased In concentration and an increased energy band gap in the both end regions of the trench, whereby light absorption can be reduced in the regions near the mirrors.

Figure 3:
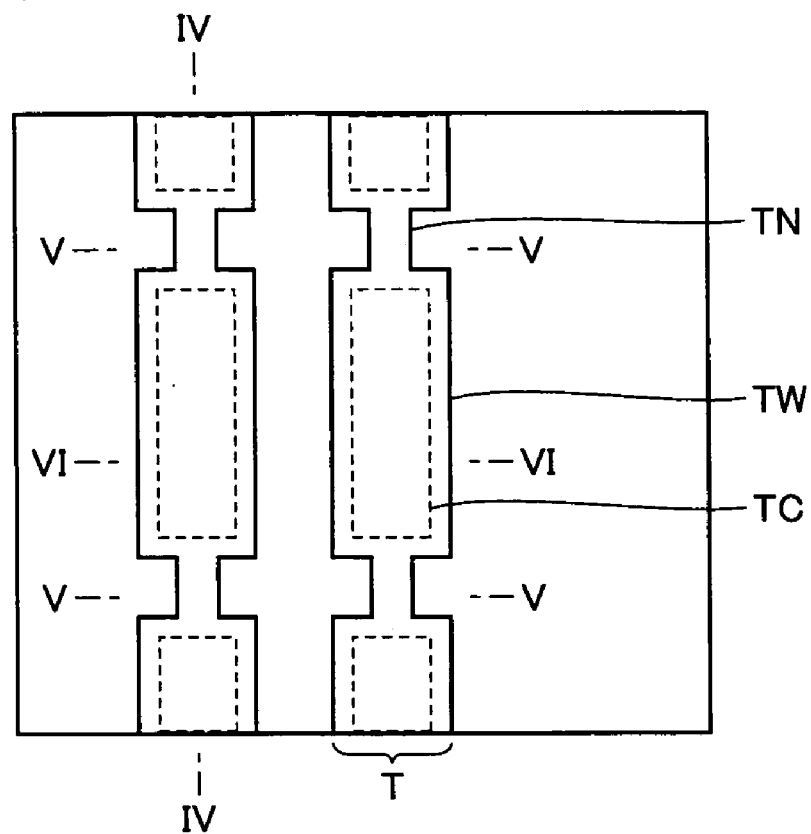
FIG. 3 is a schematic plan view showing one example of a nitride semiconductor laser wafer according to the present invention, representing a trench pattern on the substrate.
Figure 4:
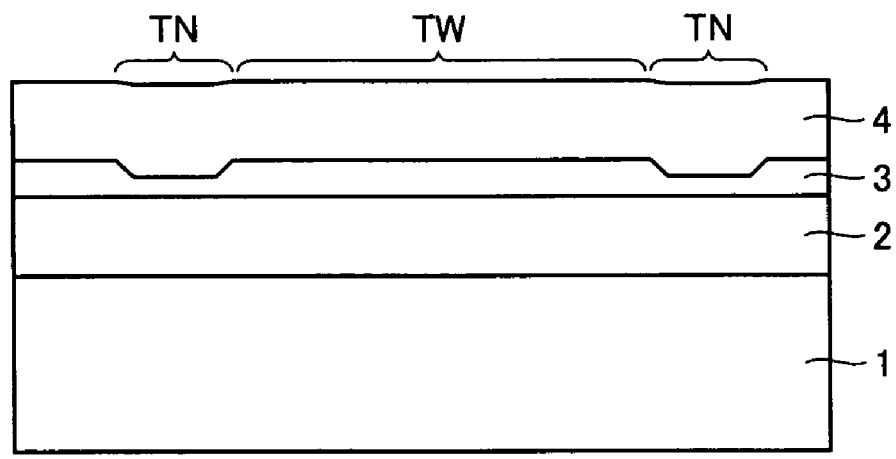
FIG. 4 is a schematic sectional view along a line IV-IV in FIG. 3.
Figure 5:
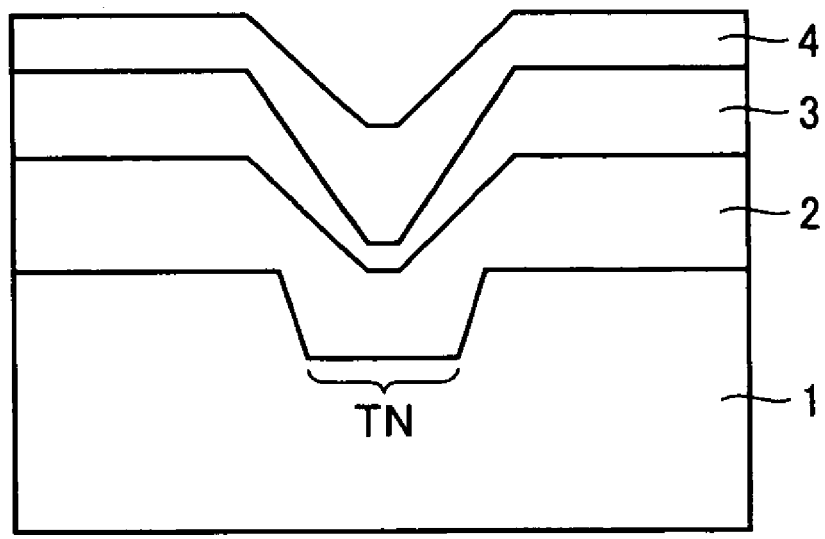
FIG. 5 is a schematic sectional view along a line V-V in FIG. 3.
Figure 6:
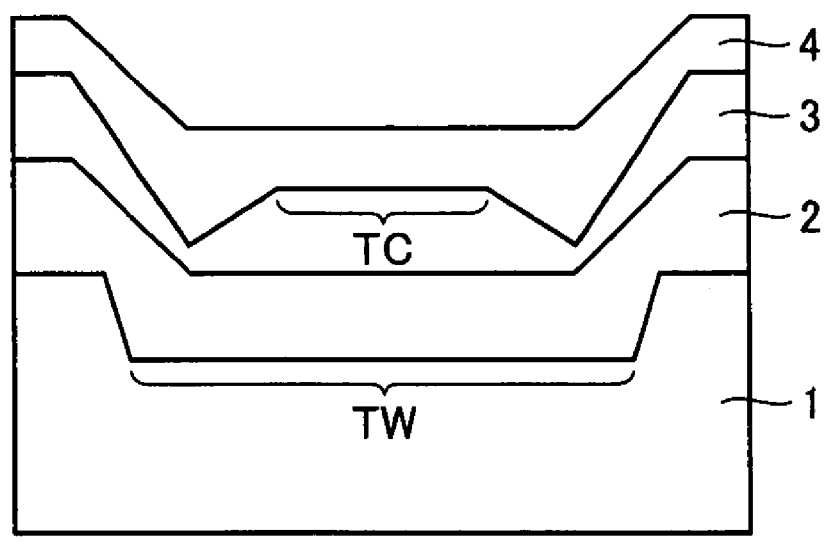
FIG. 6 is a schematic sectional view along a line VI-VI in FIG. 3.

The schematic plan view of FIG. 3 illustrates a method of producing a nitride semiconductor laser device according to an embodiment of the present invention. FIG. 4 is a sectional view along a line IV-IV in FIG. 3. FIG. 5 is a sectional view along a line V-V in FIG. 3. FIG. 6 is a sectional view along a line VI-VI in FIG. 3. While a plurality of trenches are shown in FIG. 3, only one trench is shown in each of FIGS. 5 and 6, for simplification and clarity of the drawings.

As shown in FIG. 3, a plurality of parallel trenches T are formed by etching on a top face of a substrate 1. Each trench includes wide-width regions TW and narrow-width regions TN arranged alternately. It is preferable that wide-width region TW has a width larger than 20 μm and then narrow-width region TN has a width larger than 2 μm and smaller than 20 μm. It is also preferable that Trench T has a depth of larger than 0.1 μm and smaller than 4 μm. On substrate 1 having the trenches, a lower semiconductor multi-layer structure 2 including an n-type lower clad layer, a nitride semiconductor active layer 3 containing In, and an upper semiconductor multi-layer structure 4 including a p-type upper clad layer are deposited sequentially (see FIG. 4, FIG. 5, and FIG. 6).

In this case, during crystal growth of nitride semiconductor active layer 3 containing In, In atoms tend to move outside from narrow-width region TN of trench T. Therefore, the In concentration in nitride semiconductor active layer 3 becomes lower in narrow-width region TN than in other regions, or In and Ga atoms tend to migrate outside the trench and as a result, nitride semiconductor active layer 3 has a decreased thickness in narrow-width region TN as shown in FIGS. 4 and 5. Both physical phenomena produce an increased energy band gap.

On the other hand, tendency of In and/or Ga atoms contained in nitride semiconductor active layer 3 to move outside from trench T is significant near edges of wide-width region TW but is weak in a central region TC shown by broken lines in FIG. 3. As a result, nitride semiconductor active layer 3 has a reduced thickness or lower In composition in a limited region near the edge of wide-width region TW as shown in FIG. 6 and then has an increased energy band gap. In central region TC, however, the thickness or In composition of nitride semiconductor active layer 3 is little reduced and the energy band gap does not increase.

In the nitride semiconductor laser wafer as shown in FIG. 3, well-known stripe-like optical cavities are formed substantially along the centerlines of stripe-like trenches T. Further, the laser wafer is provided with well-known positive electrodes and negative electrodes.

Thereafter, the nitride semiconductor laser wafer of FIG. 3 is cleaved along lines V-V across narrow-width regions TN of trench T into a plurality of laser bars. Further, each laser bar is segmented into a plurality of chips so that each chip includes a single stripe-like optical cavity, whereby it is possible to obtain nitride semiconductor laser devices of the present invention.

In the nitride semiconductor laser device obtained in this manner, both end mirror parts of the stripe-like optical cavity are aligned with narrow-width region TN of stripe-like trench T. As a result, in the nitride semiconductor laser device of the present invention, the active layer has a relatively greater energy band gap near both end mirror parts of the stripe-like optical cavity, so that it is less likely to cause catastrophic optical damage (COD) due to light absorption in the both end mirror parts of the optical cavity.

In the following, one example of a fabrication method of a nitride semiconductor laser device according to the present invention is described more specifically.

As substrate 1 shown in FIGS. 4 to 6, it is possible to use a substrate wafer in which at least its uppermost layer is formed of a GaN single crystal. The substrate wafer may be a bulk GaN substrate or may be a substrate wafer including an epitaxial GaN layer (template GaN layer) deposited on a sapphire, silicon carbide, zinc oxide or another appropriate substrate.

On a top face of such a substrate wafer, a patterned trench is formed by using a well-known process. For example, a silicon oxide layer having a thickness of 1000 nm is first deposited on the top face of the substrate wafer by CVD or sputtering. Then, a plurality of parallel stripe-like trenches T are formed on the top face of the substrate wafer as shown in FIG. 3 by photolithography utilizing photoresist and reactive ion etching.

This stripe-like trench T includes, for example, narrow-width region TN of 10 μm width and wide-width region TW of 100 μm width. Lengths of narrow-width region TN and wide-width region TW may be set, for example, to be 40 μm and 800 μm, respectively.

On patterned substrate 1, there are sequentially deposited, for example, an n-type GaN layer and an n-type $Al_{0.06}Ga_{0.94}N$ layer of 1800 nm thickness included in lower semiconductor multi-layer structure 2. On this lower semiconductor multi-layer structure 2, there are sequentially deposited, for example, an undoped GaN layer (barrier layer) of 100 nm thickness, an undoped $In_{0.1}Ga_{0.9}N$ layer (quantum well layer) of 2 nm thickness, and an undoped GaN layer (barrier layer) of 100 nm thickness included in active layer 3. On active layer 3, there are sequentially deposited, for example, a p-type $Al_{0.06}Ga_{0.94}N$ layer of 1800 nm thickness and a p-type GaN layer of 100 nm thickness included in the upper semiconductor multi-layer structure.

As described previously, stripe-like optical cavities are formed in a nitride semiconductor laser wafer by any of well-known methods. For example, such a stripe-like optical cavity may be formed by providing a well-known ridge stripe structure or a well-known current-constricting layer. In such a case, the stripe-like optical cavity is formed substantially along the centerline of stripe-like trench T. In the case of fabricating a laser diode including a ridge stripe structure, for example, a narrow-width ridge may be formed by etching along the centerline of trench T. This ridge preferably has a width of equal to or less than the width of narrow-width region TN of trench T. A positive metal electrode is formed on the upper semiconductor multi-layer structure, and a negative metal electrode is formed such that it is electrically connected with an n-type layer included in the lower semiconductor multi-layer structure.

The laser wafer thus fabricated is split into bars in the direction orthogonal to narrow-width region TN of each trench T. Each of the obtained laser bars is cut into laser chips each including a single stripe-like optical cavity.

In the nitride semiconductor laser device thus obtained, both end mirror parts of the stripe-like optical cavity are aligned with narrow-width region TN of stripe-like trench T as described above, and the active layer has a relatively greater energy band gap near these both end mirror parts. Therefore, catastrophic optical damage (COD) due to light absorption in the both end mirror parts of the optical cavity is less likely to occur.

Figure 7:
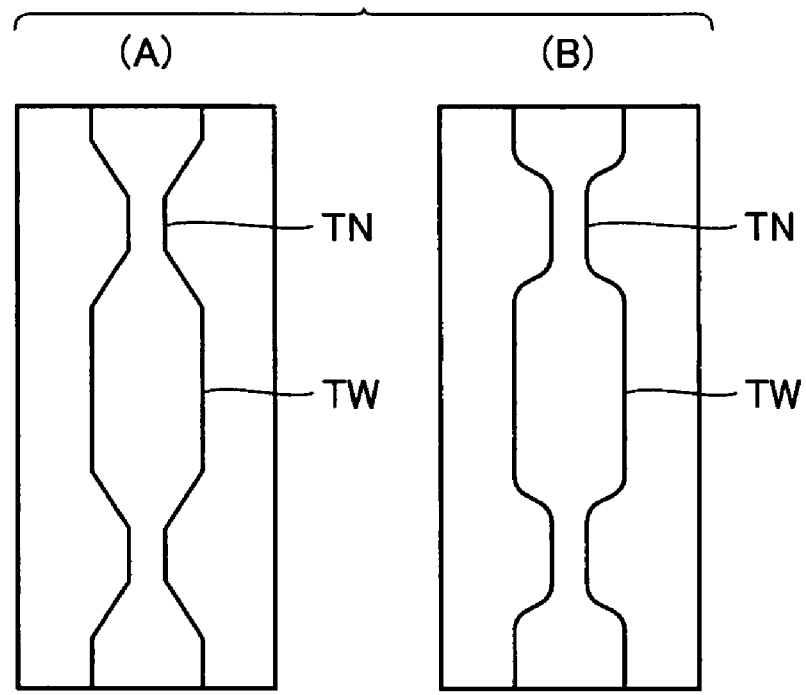
FIGS. 7(A) and 7(B) are schematic plan views showing examples of trench patterns which are different from FIG. 3.

In FIG. 3 described above, the width between narrow-width region TN and wide-width region TW of trench T is discontinuously changed. Between narrow-width region TN and wide-width region TW of trench T, however, a transition region with a taper part whose width changes linearly as shown in the schematic plan view of FIG. 7(A) may be interposed, or a transition region with a curved edge part whose width changes smoothly without creating any angle as shown in the schematic plan view of FIG. 7(B) may be interposed. Such a transition region provides smooth change in the In concentration or thickness of the active layer.

Figure 8:
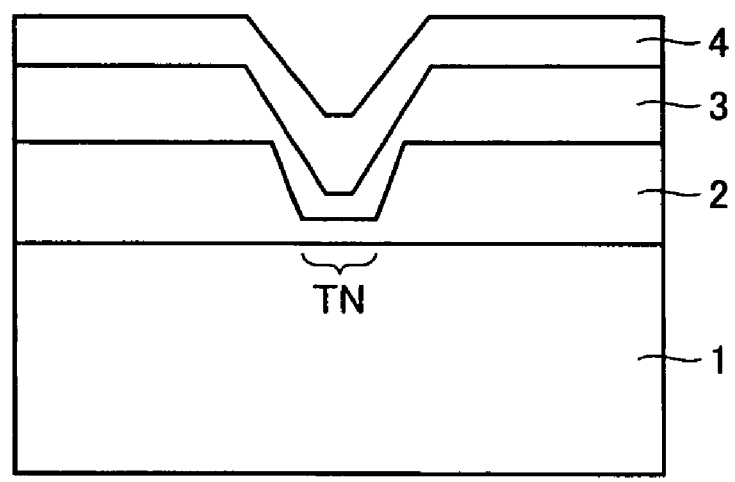
FIG. 8 is a schematic sectional view showing variations of the trench design shown in FIG. 5.

Further, as another embodiment of the present invention, trench T may be formed after depositing, for example, the aforementioned n-type $Al_{0.06}Ga_{0.94}N$ layer included in the lower semiconductor multi-layer structure, as shown in the schematic sectional view of FIG. 8. Then, the semiconductor laser device is fabricated in a similar manner as in the above embodiment (see FIG. 8).

As described above, according to the present invention, it is possible to provide a nitride semiconductor laser device capable of outputting high power light and having a long lifetime in a relatively simple and reliable manner only by forming a trench having both end regions of a decreased width in a layer under the nitride semiconductor active layer containing In.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor laser device comprising a semiconductor multi-layer structure including at least a lower clad layer of a first conductive type, an active layer, and an upper clad layer of a second conductive type stacked in this order on a substrate, wherein
   a layer under said active layer includes a stripe-like trench;
   said semiconductor multi-layer structure includes a stripe-like optical cavity arranged along said stripe-like trench;
   said stripe-like trench has a narrower width in its both end regions as compared with its central main region; and
   said active layer is formed of a nitride semiconductor containing In.

2. The nitride semiconductor laser device according to claim 1, wherein said active layer has a less In concentration in the narrower end regions of said stripe-like trench than in the central main region.

3. The nitride semiconductor laser device according to claim 2, wherein said active layer has a greater energy band gap in the narrower end regions of said stripe-like trench than in the central main region.

4. The nitride semiconductor laser device according to claim 2, wherein said active layer has a smaller thickness in the narrower end regions of said stripe-like trench than in the central main region.

5. A method of producing the nitride semiconductor laser device of claim 1, comprising:

forming said stripe-like trench including alternate wide-width regions and narrow-width regions on said substrate by etching;

depositing said lower clad layer of the first conductive type, said active layer, and said upper clad layer of the second conductive type in this order on said substrate;

conducting cleavage across each of said narrow-width regions of said stripe-like trench; and conducting chip segmentation for each of said stripe-like optical cavity.

6. A method of producing the nitride semiconductor laser device of claim 1, comprising:

depositing up to said lower clad layer of the first conductive type on said substrate, forming said stripe-like trench including alternate wide-width regions and narrow-width regions by etching from a top face of said lower clad layer;

depositing said active layer and said upper clad layer of the second conductive type in this order;

conducting cleavage across each of said narrow-width regions of said stripe-like trench; and conducting chip segmentation for each of said stripe-like optical cavity.

* * * * *